(12) United States Patent
Uchiyama

(10) Patent No.: US 8,541,251 B2
(45) Date of Patent: Sep. 24, 2013

(54) METHOD FOR MANUFACTURING LIGHT-EMITTING DEVICE

(75) Inventor: Naoki Uchiyama, Hamamatsu (JP)

(73) Assignee: Hamamatsu Photonics K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 13/548,632

(22) Filed: Jul. 13, 2012

(65) Prior Publication Data
US 2013/0023076 A1    Jan. 24, 2013

(30) Foreign Application Priority Data
Jul. 21, 2011 (JP) ................ P2011-160027

(51) Int. Cl.
*H01L 21/00* (2006.01)
(52) U.S. Cl.
USPC ............... 438/33; 438/29; 438/463; 438/113; 257/E21.599
(58) Field of Classification Search
USPC ............. 438/29, 33, 113, 458, 460–465; 257/E21.599
See application file for complete search history.

(56) References Cited

U.S. PATENT DOCUMENTS

| | | | |
|---|---|---|---|
| 6,420,678 B1* | 7/2002 | Hoekstra | 219/121.75 |
| 2006/0121697 A1* | 6/2006 | Fujii et al. | 438/460 |
| 2007/0298529 A1* | 12/2007 | Maeda et al. | 438/33 |
| 2011/0298084 A1* | 12/2011 | Tamemoto | 257/507 |

FOREIGN PATENT DOCUMENTS
JP    2005-166728    6/2005

* cited by examiner

*Primary Examiner* — Mary Wilczewski
*Assistant Examiner* — Erik T Peterson
(74) *Attorney, Agent, or Firm* — Drinker Biddle & Reath LLP

(57) ABSTRACT

A light-emitting device manufacturing method comprises the steps of irradiating a substrate 2 having a III-V compound semiconductor layer 17 formed on a front face 2a with laser light L1 along lines to cut 5a, 5b, while locating a converging point P1 within the sapphire substrate 2 and using a rear face 2b thereof as a laser light entrance surface, and thereby forming modified regions 7a, 7b along the lines 5a, 5b within the substrate 2; then forming a light-reflecting layer on the rear face 2b of the substrate 2; and thereafter extending fractures generated from the modified regions 7a, 7b acting as a start point in the thickness direction of the substrate 2, and thereby cutting the substrate 2, the semiconductor layer 17 and the light-reflecting layer along the lines 5a, 5b, and manufacturing a light-emitting device.

11 Claims, 24 Drawing Sheets

Fig.13
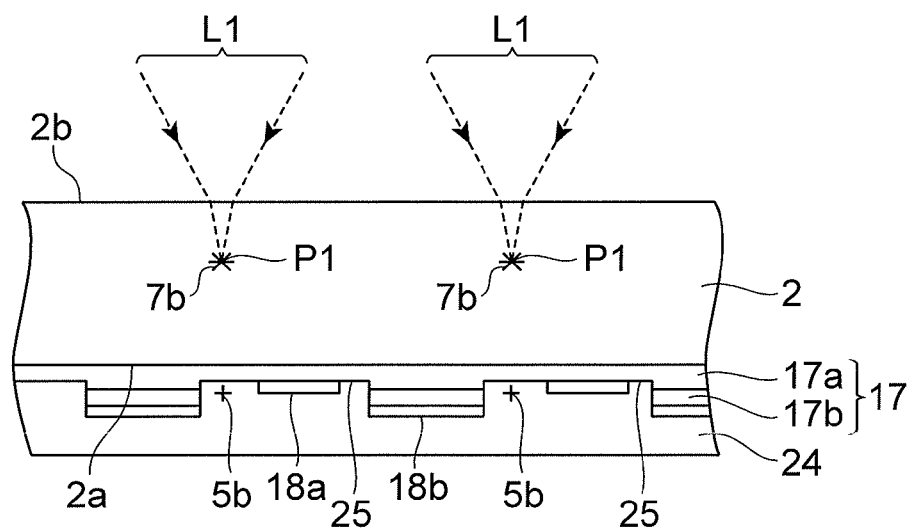
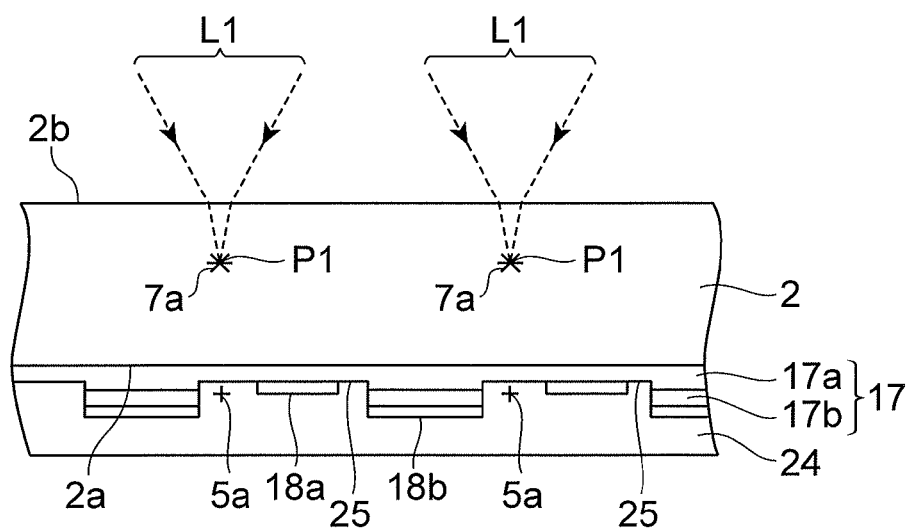

Fig.15
(a)
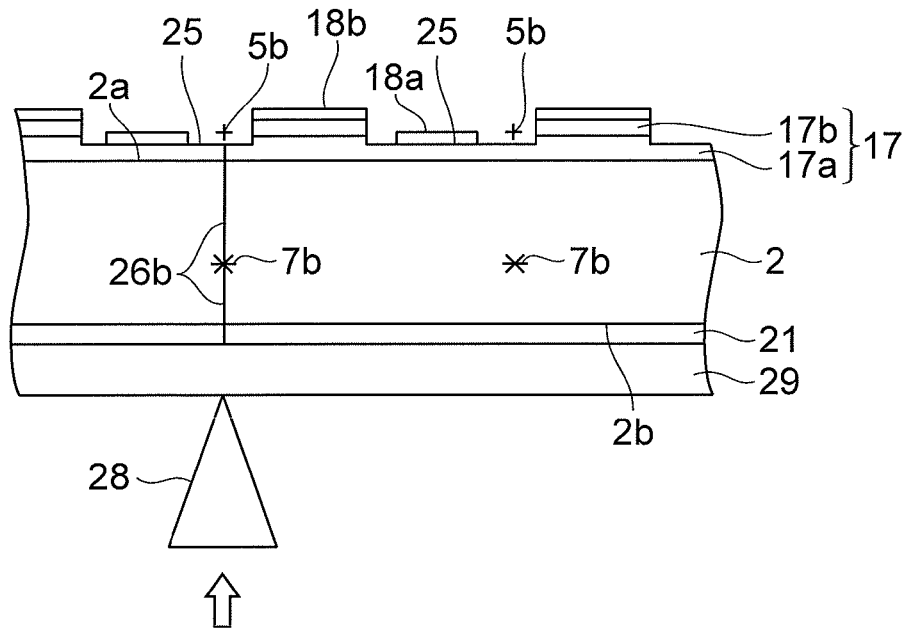
(b)
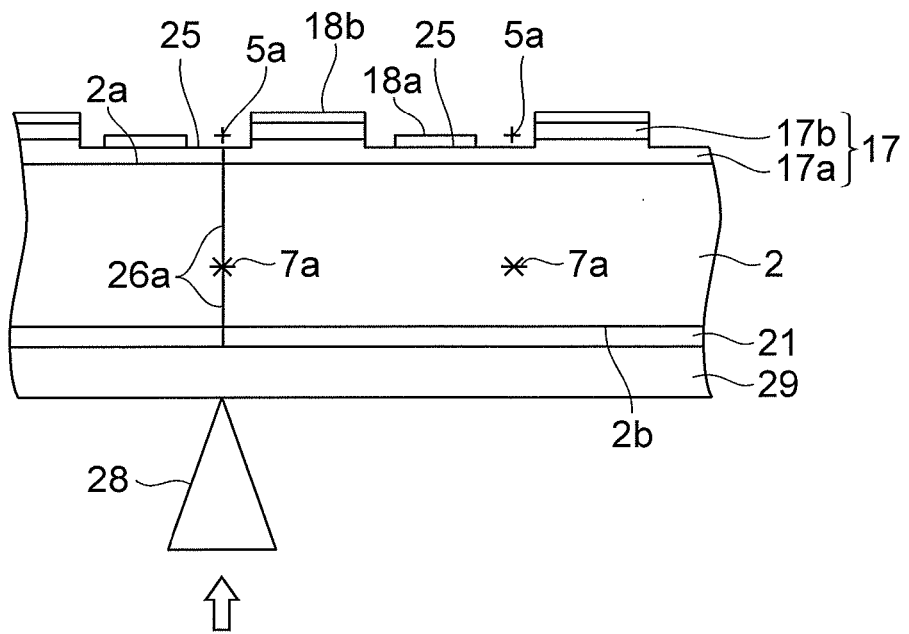

Fig.17
(a)
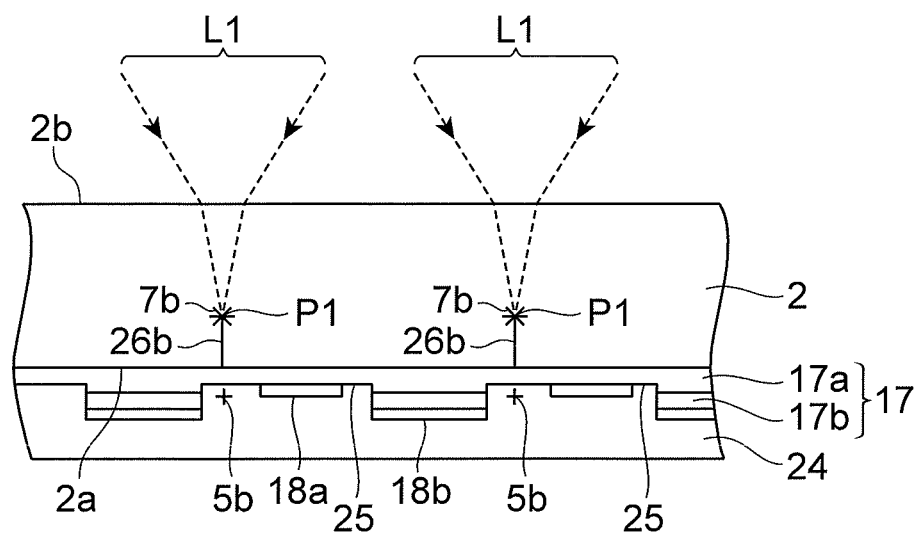
(b)
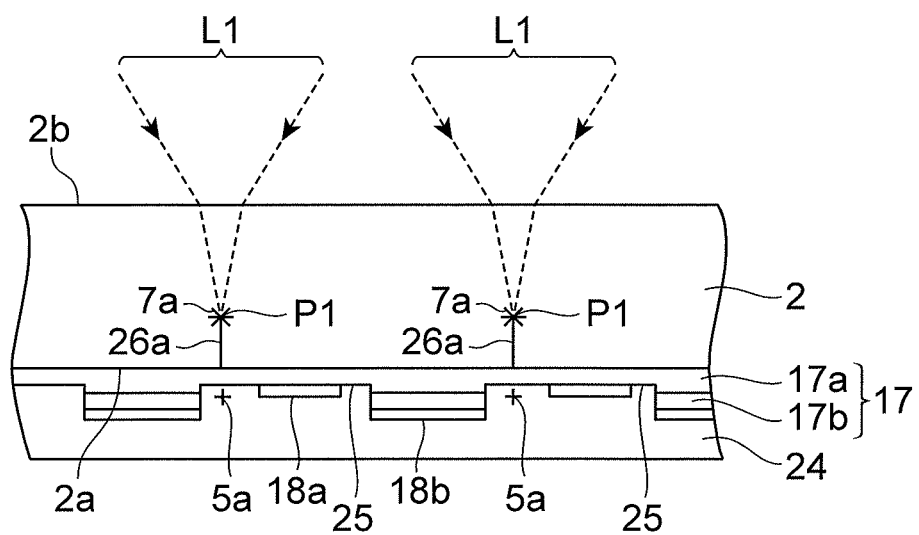

*Fig.18*
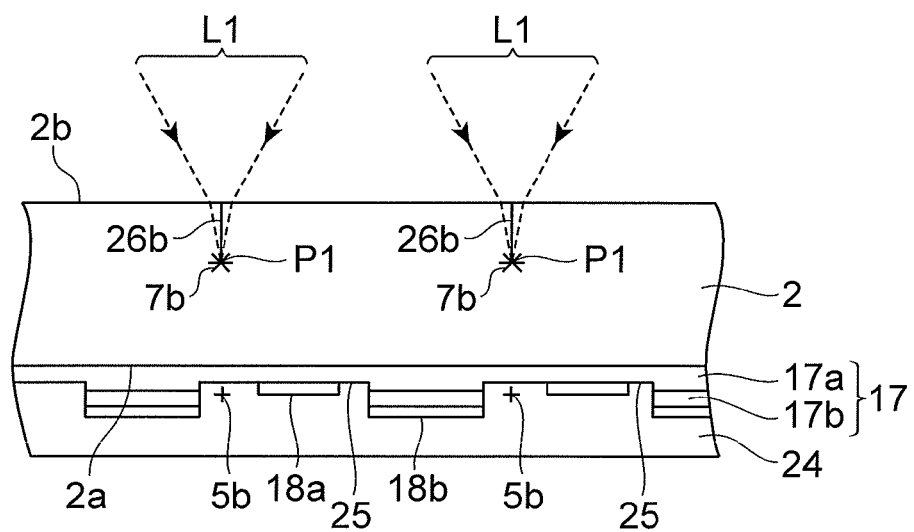
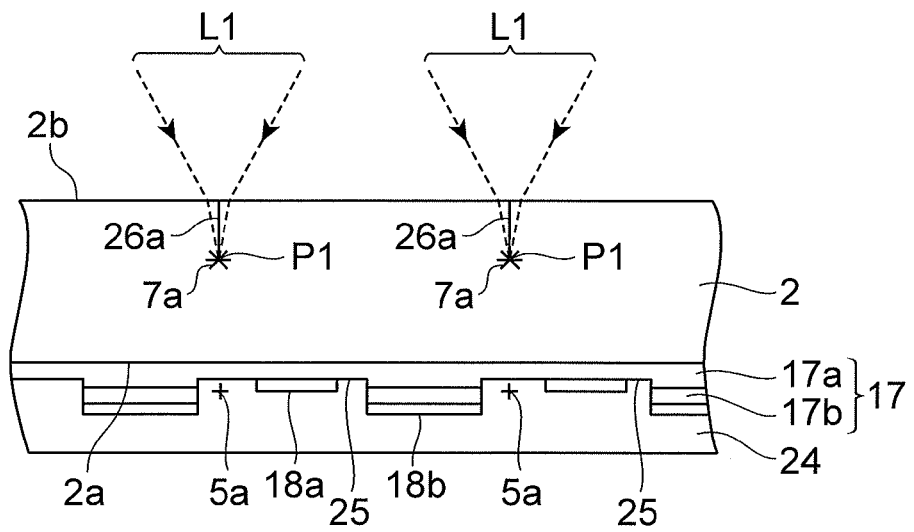

Fig.19
(a)
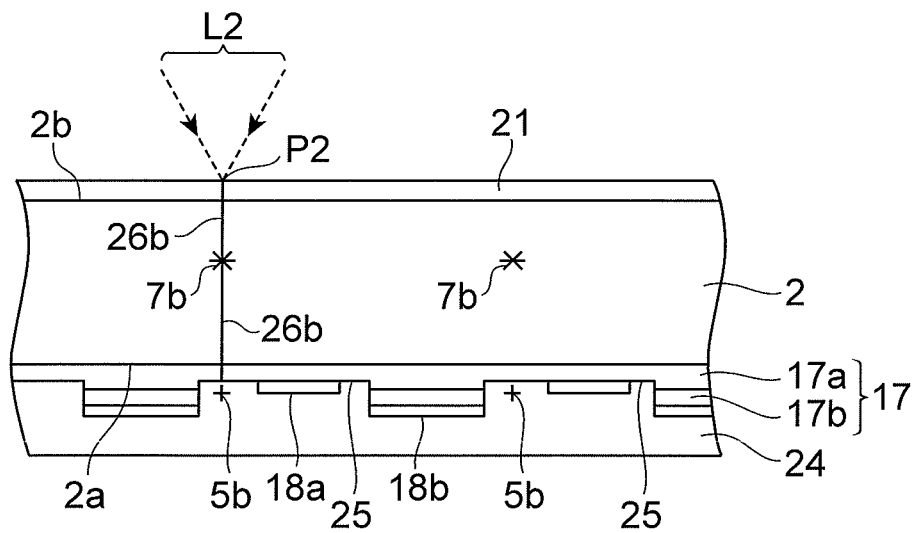
(b)
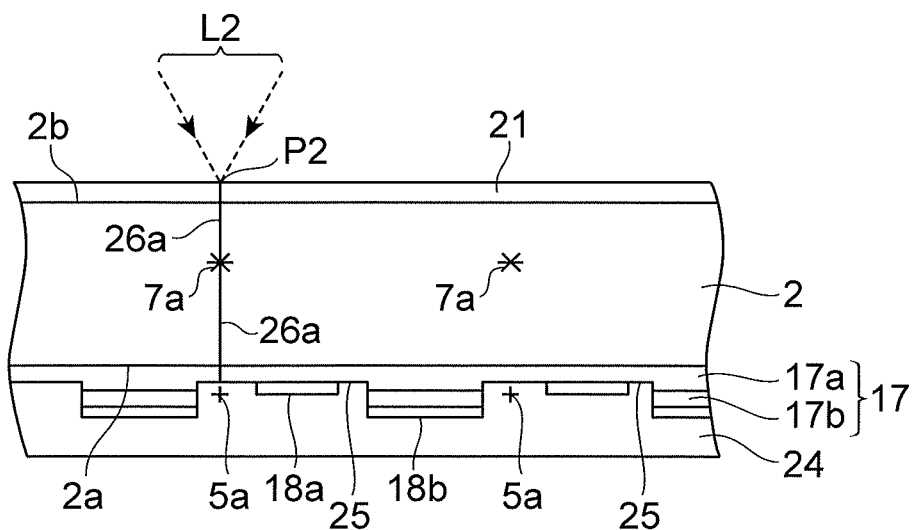

Fig.20
(a)
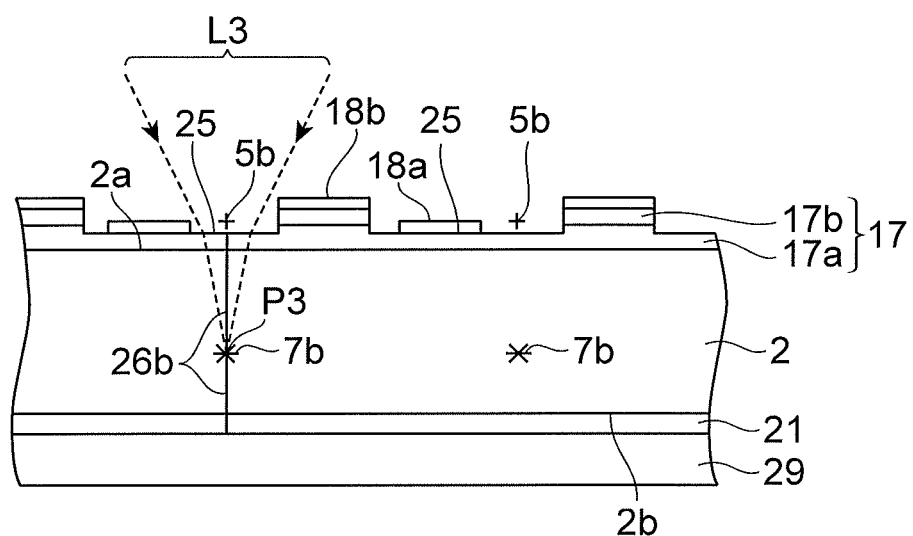
(b)
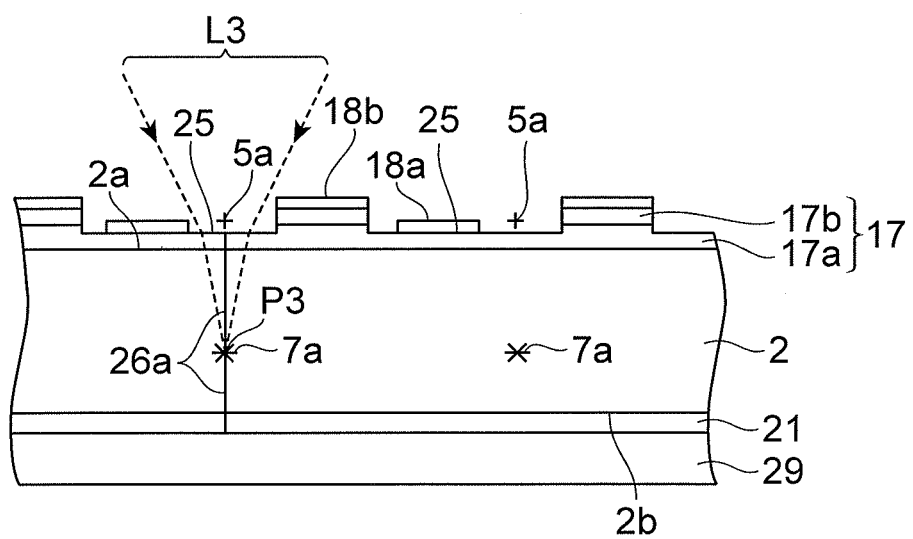

Fig.24
(a)
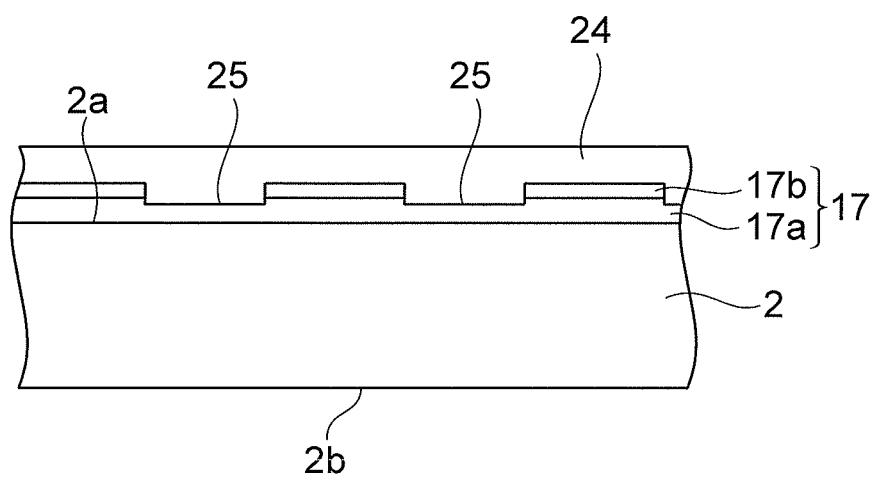
(b)
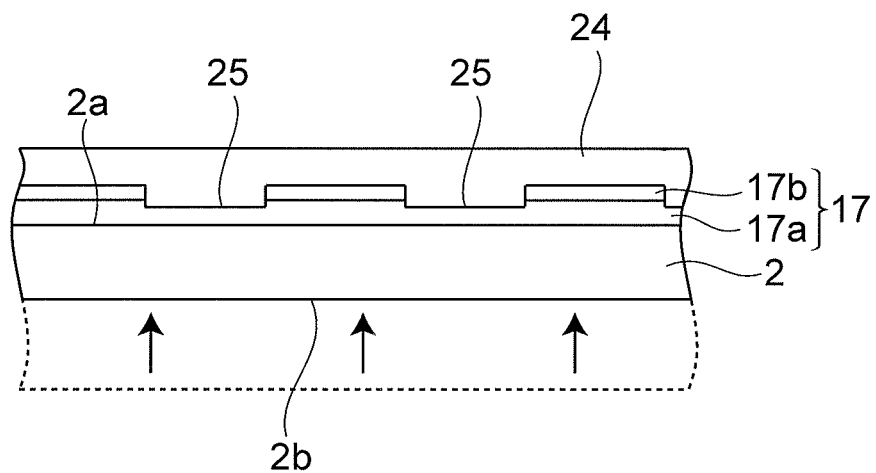

METHOD FOR MANUFACTURING LIGHT-EMITTING DEVICE

BACKGROUND OF THE INVENTION

1. Field of the Invention

The present invention relates to a method for manufacturing a light-emitting device.

2. Related Background Art

The following has been known as a method for manufacturing a light-emitting device by cutting a wafer in which a III-V compound semiconductor layer is formed on a front face of a sapphire substrate. That is a method comprising the steps of irradiating the sapphire substrate with laser light while locating a converging point therewithin, so as to form a modified region within the sapphire substrate along a line to cut, and cutting the sapphire substrate and the III-V compound semiconductor layer from the modified region acting as a start point (see, for example, Japanese Patent Application Laid-Open No. 2005-166728).

SUMMARY OF THE INVENTION

There are cases where a light-reflecting layer is formed on the rear face of the sapphire substrate in the above-mentioned light-emitting device in order to enhance its emission efficiency.

It is therefore an object of the present invention to provide a method for manufacturing a light-emitting device which can manufacture with a favorable yield a light-emitting device having a light-reflecting layer formed on a rear face of a sapphire substrate.

The light-emitting device manufacturing method in accordance with one aspect of the present invention comprises a second step of irradiating a sapphire substrate having a front face formed with a III-V compound semiconductor layer with first laser light along a predetermined line to cut while locating a converging point within the sapphire substrate and using a rear face of the sapphire substrate as a laser entrance surface, and thereby forming a modified region within the sapphire substrate along the line; a third step of forming a light-reflecting layer on the rear face of the sapphire substrate after the second step; and a fourth step of extending a fracture generated from the modified region acting as a start point in a thickness direction of the sapphire substrate after the third step, and thereby cutting the sapphire substrate, the III-V compound semiconductor layer and the light-reflecting layer along the line, and manufacturing the light-emitting device.

In this light-emitting device manufacturing method, before forming the light-reflecting layer on the rear face of the sapphire substrate, the modified region is formed within the sapphire substrate by irradiation with the first laser light using the rear face of the sapphire substrate as the laser light entrance surface. As a consequence, the light-reflecting layer does not inhibit the first laser light from converging, whereby a desirable modified region can be formed within the sapphire substrate. Using the rear face of the sapphire substrate as the laser light entrance surface can also restrain the irradiation with the first laser light from damaging the III-V compound semiconductor layer. Since the modified region is formed within the sapphire substrate, a desirable light-reflecting layer can be formed on the rear face of the sapphire substrate. As in the foregoing, this light-emitting device manufacturing method can cut the sapphire substrate formed with the desirable III-V compound semiconductor layer and light-reflecting layer from the desirable modified region acting as a start point, whereby a light-emitting device having the light-reflecting layer formed on the rear face of the sapphire substrate can be manufactured with a favorable yield. Here, "within the sapphire substrate" is meant to include the front face of the sapphire substrate formed with the III-V compound semiconductor layer as well. The method may further comprise a first step of forming the III-V compound semiconductor layer on the front face of the sapphire substrate before the second step.

In the second step, the modified region may be formed within the sapphire substrate along the line so that the fracture to be extended in the thickness direction of the sapphire substrate in the fourth step reaches at least the front face of the sapphire substrate beforehand. This makes it easy to cut the sapphire substrate, III-V compound semiconductor layer, and light-reflecting layer along the line in the fourth step and can improve the accuracy in cutting the III-V compound semiconductor layer in particular.

Alternatively, in the second step, the modified region may be formed within the sapphire substrate along the line so that the fracture to be extended in the thickness direction of the sapphire substrate in the fourth step reaches the rear face of the sapphire substrate beforehand. This makes it easy to cut the sapphire substrate, III-V compound semiconductor layer, and light-reflecting layer along the line in the fourth step and can improve the accuracy in cutting the light-reflecting layer in particular.

In the fourth step, a knife edge may be pressed along the line from the light-reflecting layer side, and thereby the fracture generated from the modified region acting as the start point may be extended in the thickness direction. This can easily cut the sapphire substrate, III-V compound semiconductor layer, and light-reflecting layer along the line while restraining the pressing of the knife edge from damaging the III-V compound semiconductor layer.

The method may further comprise the step of irradiating the sapphire substrate with second laser light absorbable in the light-reflecting layer from the light-reflecting layer side along the line after the third step but before the fourth step, and thereby extending the fracture generated from the modified region acting as the start point in the thickness direction of the sapphire substrate, in the fourth step, the fracture generated from the modified region acting as the start point may be further extended in the thickness direction of the sapphire substrate, and thereby the sapphire substrate, the III-V compound semiconductor layer and the light-reflecting layer may be cut along the line. Alternatively, in the fourth step the sapphire substrate may be irradiated with the second laser light absorbable in the light-reflecting layer from the light-reflecting layer side along the line, and thereby the fracture generated from the modified region acting as the start point may be extended in the thickness direction of the sapphire substrate. These can extend the fracture generated from the modified region acting as the start point in the thickness direction of the sapphire substrate while restraining the irradiation with the second laser light from damaging the III-V compound semiconductor layer.

The method may further comprise the step of irradiating the sapphire substrate with third laser light transmittable through the III-V compound semiconductor layer from the III-V compound semiconductor layer side along the line while locating a converging point within the sapphire substrate after the third step but before the fourth step, and thereby extending the fracture generated from the modified region acting as the start point in the thickness direction of the sapphire substrate, in the fourth step, the fracture generated from the modified region acting as the start point may be further extended in the thickness direction of the sapphire substrate, and thereby the sapphire substrate, the III-V compound semiconductor layer and the light-reflecting layer may be cut along the line. Alternatively, in the fourth step, the sapphire substrate may be irradiated with third laser light transmittable through the III-V compound semiconductor layer from the III-V compound semiconductor layer side along the line while locating a converging point within the sapphire substrate, and thereby the fracture generated from the modified region acting as the start point may be extended in the thickness direction of the sapphire substrate. In these cases, since the third laser light is transmittable through the III-V compound semiconductor layer, the fracture generated from the modified region acting as the start point can be extended in the thickness direction of the sapphire substrate while restraining the irradiation with the third laser light from damaging the III-V compound semiconductor layer.

Here, the sapphire substrate may be irradiated with the third laser light from the III-V compound semiconductor layer side along the line in only an intersecting part of the line. This can extend the fracture generated from the modified region acting as the start point in the thickness direction in the intersecting part of the line where accuracy in cutting is required, while further restraining the irradiation with the third laser light from damaging the III-V compound semiconductor layer.

BRIEF DESCRIPTION OF THE DRAWINGS

FIG. 13 is a partial sectional view of the wafer in a state where the modified region is formed in the sapphire substrate of FIG. 12;

FIG. 15 is a partial sectional view of the wafer in a state where the wafer of FIG. 14 is cut;

FIG. 17 is a partial sectional view of the wafer in a state where the modified region is formed in the sapphire substrate in the light-emitting device manufacturing method in accordance with a second embodiment of the present invention;

FIG. 18 is a partial sectional view of the wafer in a state where the modified region is formed in the sapphire substrate in the light-emitting device manufacturing method in accordance with a third embodiment of the present invention;

FIG. 19 is a partial sectional view of the wafer in a state where fractures are extended in the light-emitting device manufacturing method in accordance with a fourth embodiment of the present invention;

FIG. 20 is a partial sectional view of the wafer in a state where fractures are extended in the light-emitting device manufacturing method in accordance with a fifth embodiment of the present invention;

FIG. 24 is a partial sectional view of the wafer illustrating an example of methods for polishing the rear face of the substrate.

DESCRIPTION OF THE PREFERRED EMBODIMENTS

Figure 1:
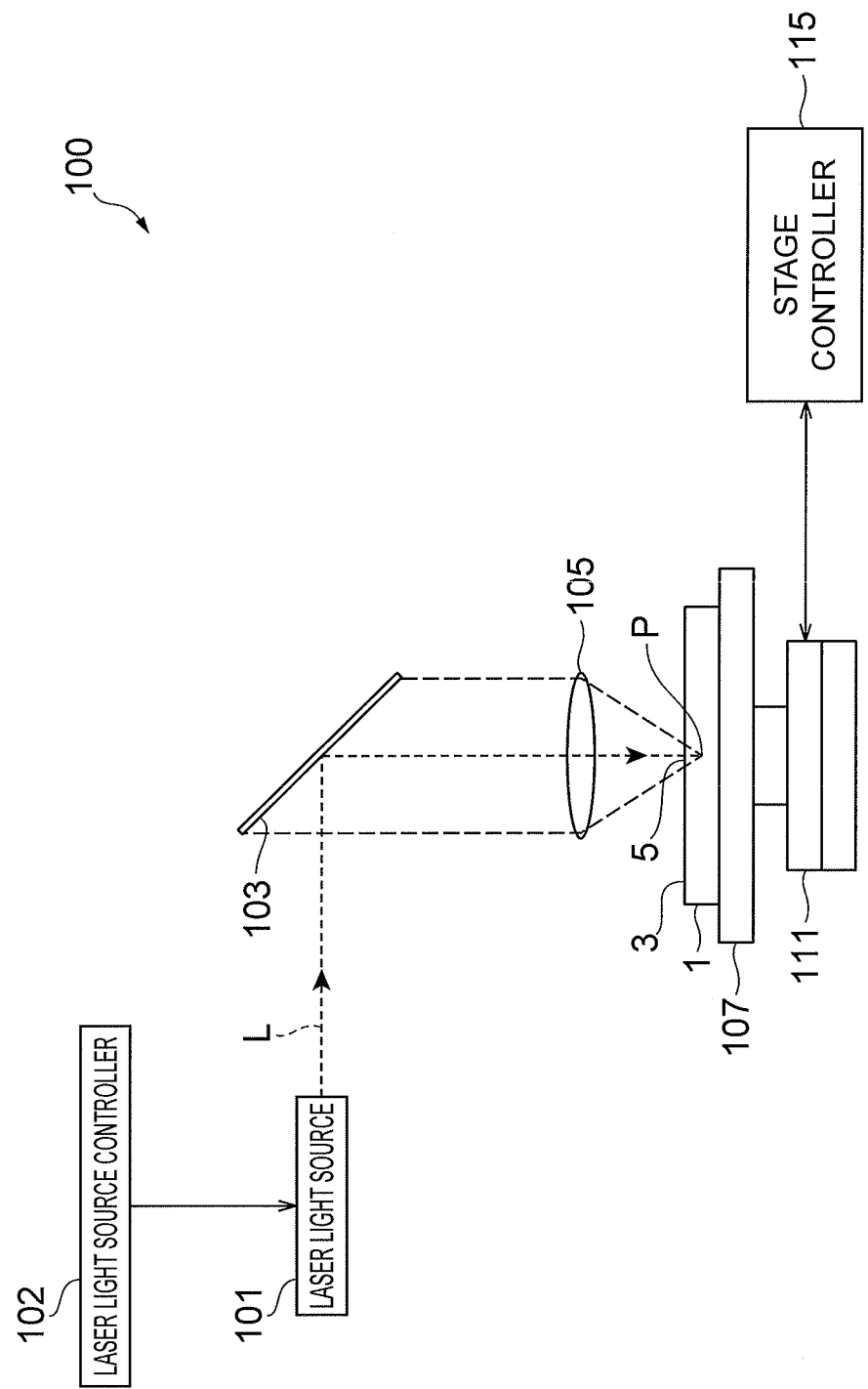
FIG. 1 is a schematic structural diagram of a laser processing device used for forming a modified region.

In the following, preferred embodiments of the present invention will be explained in detail with reference to the drawings. In the drawings, the same or equivalent parts will be referred to with the same signs, while omitting their overlapping explanations.

The light-emitting device manufacturing method in accordance with each embodiment includes the step of irradiating a sapphire substrate with laser light while locating a converging point therewithin, so as to form a modified region within the sapphire substrate along a line to cut. Therefore, the forming of the modified region in a planar object to be processed will firstly be explained with reference to FIGS. 1 to 6 without restricting it to the sapphire substrate.

As illustrated in FIG. 1, a laser processing device 100 comprises a laser light source 101 which causes laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting an object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the driving of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut 5. This forms a modified region in the object 1 along the line 5.

Figure 2:
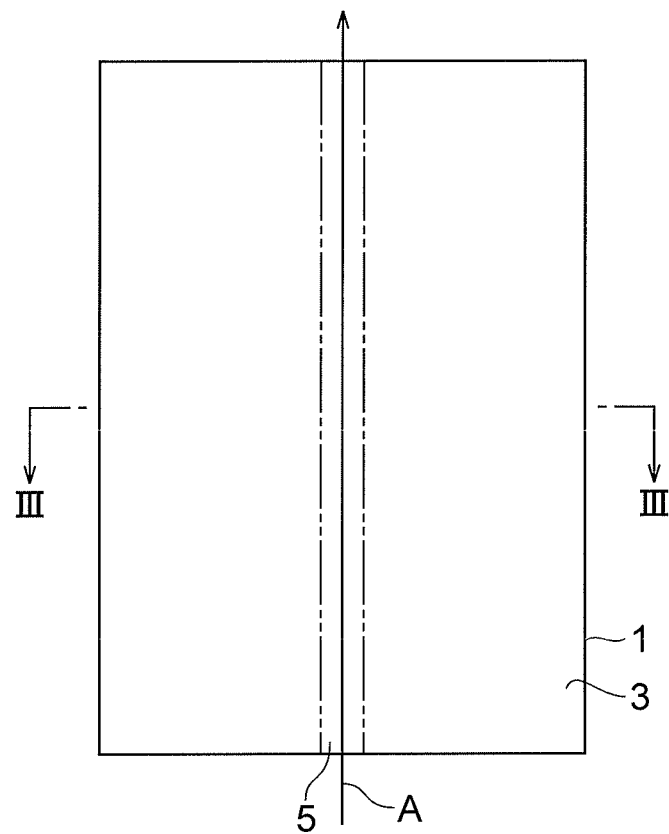
FIG. 2 is a plan view of an object to be processed in which the modified region is to be formed.
Figure 3:
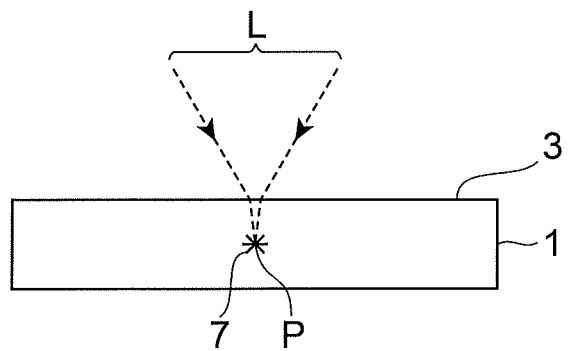
FIG. 3 is a sectional view of the object taken along the line III-III of FIG. 2.
Figure 4:
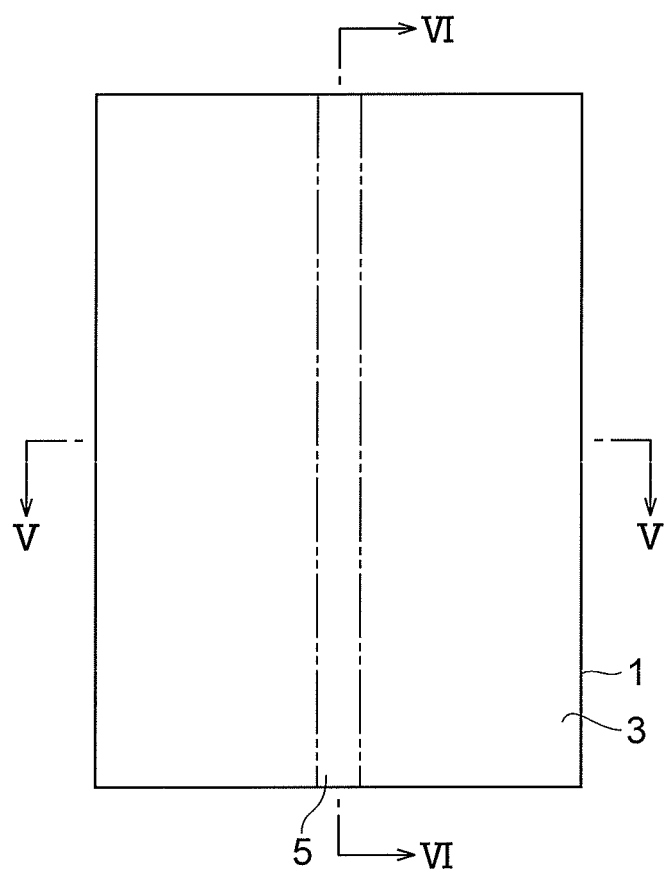
FIG. 4 is a plan view of the object after laser processing.
Figure 5:
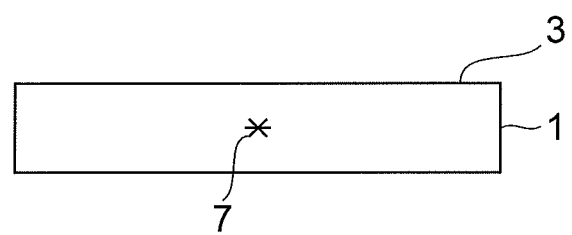
FIG. 5 is a sectional view of the object taken along the line V-V of FIG. 4.
Figure 6:
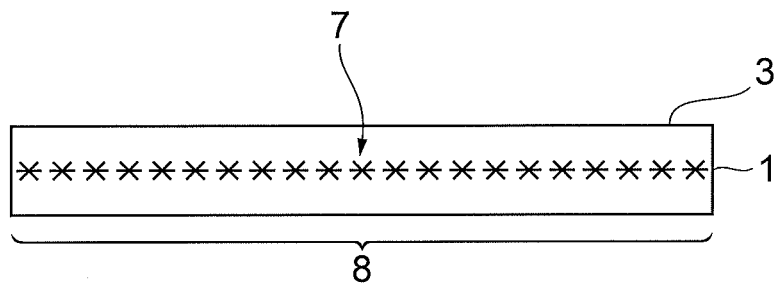
FIG. 6 is a sectional view of the object taken along the line VI-VI of FIG. 4.

Planar members (e.g., substrates and wafers) made of various materials (e.g., glass, semiconductor materials, and piezoelectric materials) are used as the object 1. As illustrated in FIG. 2, the line 5 for cutting the object 1 is set for the object 1. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a starting point region for cutting 8.

The converging point P is a position at which the laser light L is converged. The line 5 may be curved instead of being straight or a line actually drawn on a front face 3 of the object 1 without being restricted to the virtual line. The modified region 7 may be formed either continuously or intermittently. The modified region 7 may be formed like lines or dots; it will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). Hence, the front face 3 of the object 1 hardly absorbs the laser light L and thus does not melt. In the case of forming a removing part such as a hole or groove by melting it away from the front face 3 (surface absorption type laser processing), the processing region gradually progresses from the front face 3 side to the rear face side in general.

By the modified region are meant regions whose physical characteristics such as density, refractive index, and mechanical strength have attained states different from those of their surroundings. Examples of the modified region include molten processed regions, crack regions, dielectric breakdown regions, refractive index changed regions, and their mixed regions. Further examples of the modified region 7 include an area where the density has changed from that of an unmodified region in a material of the object and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (fissure, microcrack, or the like) therewithin or at an interface between the modified region and an unmodified region. The incorporated fracture may be formed over the whole surface of the modified region or in only a part or a plurality of parts thereof. Examples of the object 1 include substrates made of silicon, glass, $LiTaO_3$, and sapphire ($Al_2O_3$) and those containing such substrates and wafers.

The modified region 7 is one in which a plurality of modified spots (processing scars) are formed along the line 5. The modified spots, each of which is a modified part formed by a shot of one pulse of pulsed laser light (i.e., one pulse of laser irradiation: laser shot), gather to form the modified region 7. Examples of the modified spots include crack spots, molten processed spots, refractive index changed spots, and those mixed with at least one of them.

As for the modified spots, it will be preferred if their size and the length of fractures generated thereby are controlled as appropriate in view of required accuracy in cutting, required flatness in the cut section, thickness, kind, and crystal orientation of the object, and the like.

First Embodiment

Figure 7:
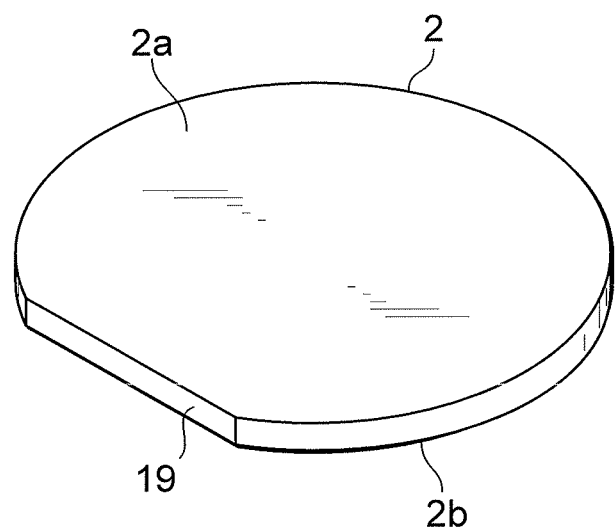
FIG. 7 is a perspective view of a sapphire substrate to be processed in the light-emitting device manufacturing method in accordance with a first embodiment of the present invention.
Figure 8:
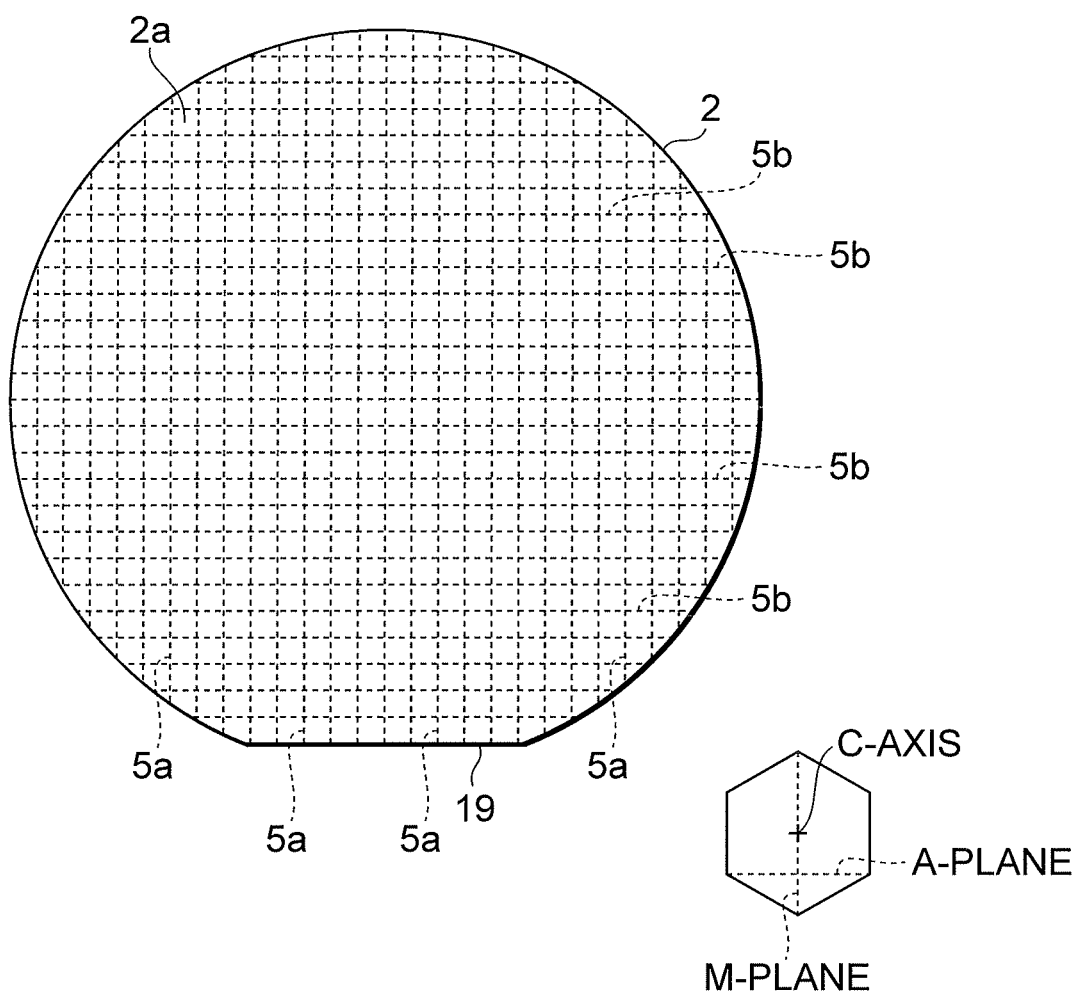
FIG. 8 is a plan view of the sapphire substrate of FIG. 7.

In the first embodiment, a light-emitting diode is manufactured as a light-emitting device in the following manner. First, as illustrated in FIGS. 7 and 8, a sapphire substrate 2 is prepared. The sapphire substrate 2 is a disc-shaped, single-crystal sapphire substrate having C-planes as a front face 2a and a rear face 2b. The M-plane of the sapphire substrate 2 is substantially perpendicular to an orientation flat (hereinafter referred to as "OF") 19, while the A-plane of the sapphire substrate 2 is substantially parallel to the OF 19.

Figure 9:
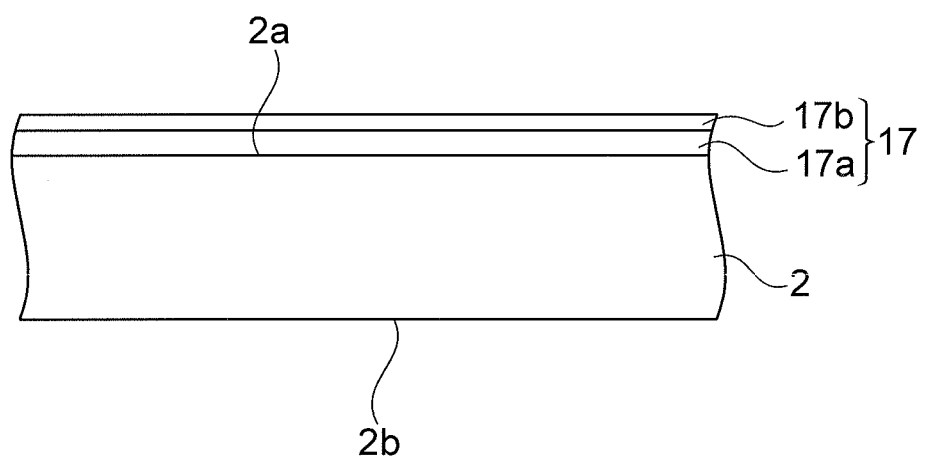
FIG. 9 is a partial sectional view of a wafer in a state where a III-V compound semiconductor layer is formed on the sapphire substrate of FIG. 8.

Next, as illustrated in FIG. 9, a III-V compound semiconductor layer (hereinafter simply referred to as "semiconductor layer") 17 is formed on the front face 2a of the sapphire substrate 2. The semiconductor layer 17 has an n-type semiconductor layer 17a, which is a first conduction type semiconductor layer mounted on the front face 2a of the sapphire substrate 2, and a p-type semiconductor layer 17b, which is a second conduction type semiconductor layer mounted on the n-type semiconductor layer 17a. The n-type semiconductor layer 17a and the p-type semiconductor layer 17b, which are made of nitride semiconductors such as GaN (III-V compound semiconductors), for example, are connected to each other through a pn-joint.

For efficiently dissipating the heat generated in the n-type semiconductor layer 17a and the p-type semiconductor layer 17b, the sapphire substrate 2 has a thickness of 50 to 200 μm, preferably 50 to 150 μm. The n-type semiconductor layer 17a has a thickness of 6 μm, for example, while the p-type semiconductor layer 17b has a thickness of 1 μm, for example.

Figure 10:
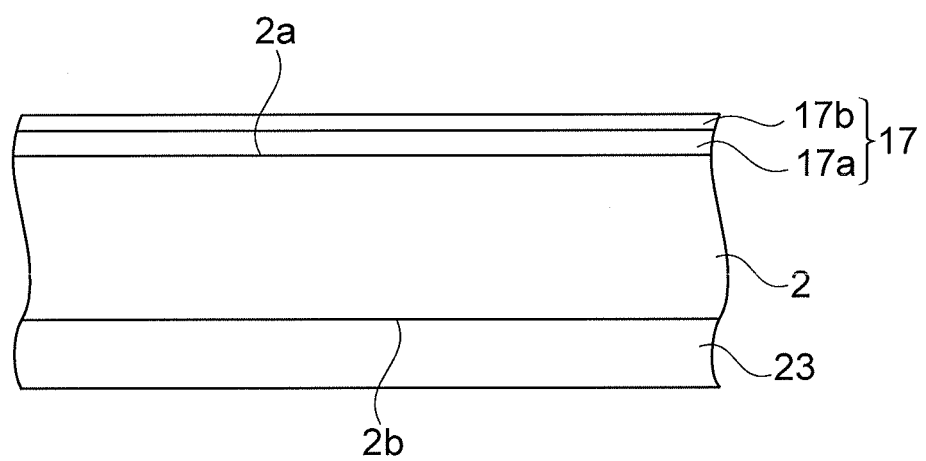
FIG. 10 is a partial sectional view of the wafer in a state where a protective tape is attached to the sapphire substrate of FIG. 9.
Figure 11:
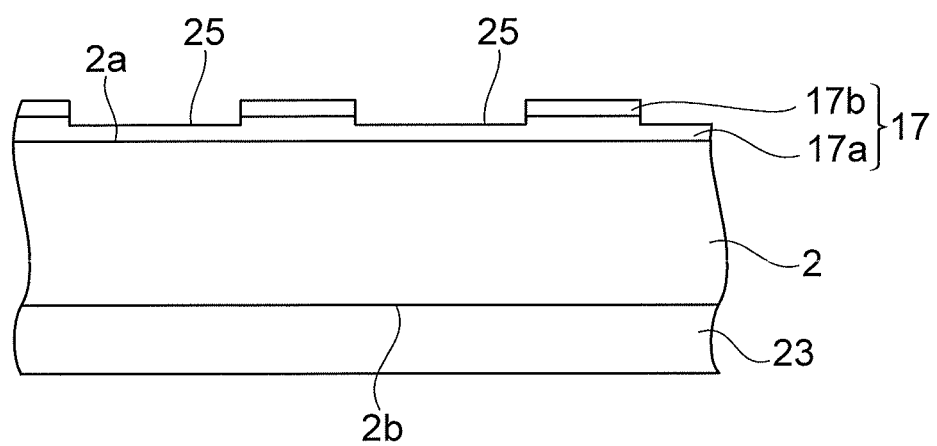
FIG. 11 is a partial sectional view of the wafer in a state where a depression is formed in the III-V compound semiconductor layer of FIG. 10.

Subsequently, as illustrated in FIG. 10, a protective tape 23 is attached to the rear face 2b of the sapphire substrate 2. Then, as illustrated in FIG. 11, the semiconductor layer 17 is etched so as to leave the p-type semiconductor layer 17b as an island in each region demarcated by lines to cut 5a, 5b (see FIG. 8), thereby forming a depression 25. Here, the bottom face of the depression 25 is located halfway through the n-type semiconductor layer 17a.

Examples of the etching method include wet etching and dry etching, any of which may be used for forming the depression 25. An example of the wet etching is etching with a mixed acid made of phosphoric acid and sulfuric acid. Examples of the dry etching include reactive ion etching (RIE), reactive ion beam etching (RIB), and ion milling. The depression 25 may also be formed by methods other than the etching.

As illustrated in FIG. 8, the lines 5a, 5b are set into grids at intervals of 2 mm, for example, for the sapphire substrate 2. A plurality of lines 5a are set along the M-plane of the sapphire substrate 2, while a plurality of lines 5b are set along the A-plane of the sapphire substrate 2. Here, the lines 5a set along the M-plane are meant to encompass not only the case where the lines 5a are parallel to the M-plane, but also the case where they tilt within the range of ±10° with respect to the M-plane. Similarly, the lines 5b set along the A-plane are meant to encompass not only the case where the lines 5b are parallel to the A-plane, but also the case where they tilt within the range of ±10° with respect to the A-plane.

Figure 12:
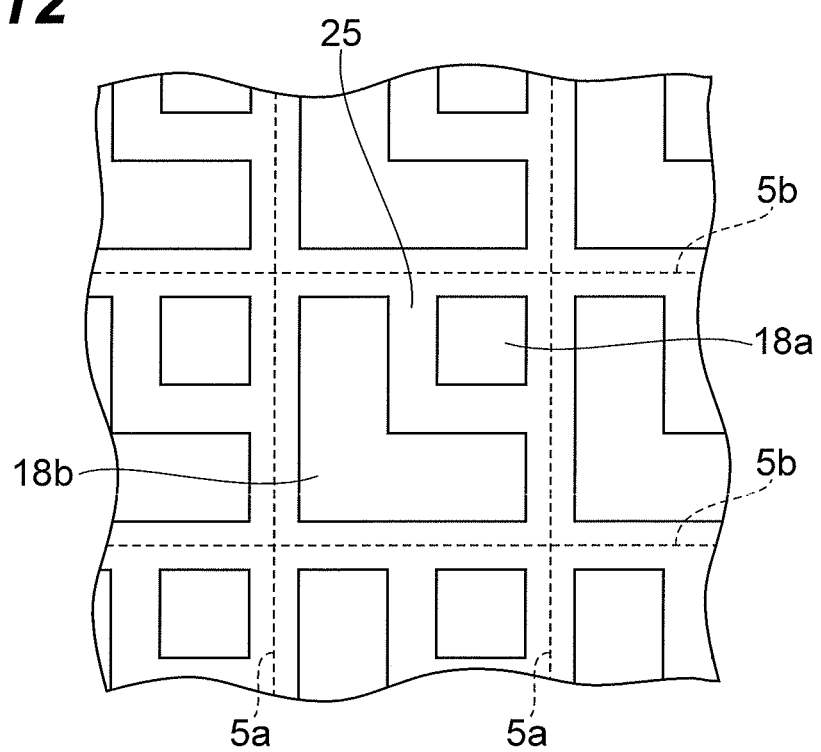
FIG. 12 is a partial plan view of the wafer in a state where electrodes are formed on the III-V compound semiconductor layer of FIG. 11.

Next, as illustrated in FIG. 12, electrodes 18a are formed on the bottom face of the depression 25 (i.e., the front face of the n-type semiconductor layer 17a exposed by etching), while electrodes 18b are formed on the front face of the p-type semiconductor layer 17b left like islands. This electrically connects the n-type semiconductor layer 17a to the electrodes 18a, and the p-type semiconductor layer 17b to the electrodes 18b.

Next, as illustrated in FIG. 13, a protective tape 24 is attached to the semiconductor layer 17 so as to cover it, and the protective tape 23 is removed from the rear face 2b of the sapphire substrate 2. In this state, using the above-mentioned laser processing device 100, modified regions 7a, 7b are formed within the sapphire substrate 2 as follows.

That is, as illustrated in FIG. 13(a), the sapphire substrate 2 is irradiated with laser light (first laser light) L1, which is pulsed laser light, along the lines 5b while locating a converging point P1 within the sapphire substrate 2 and using the rear face 2b of the sapphire substrate 2 as the laser light entrance surface. Here, the support table 107 is shifted, so as to move the laser light L1 relatively along the lines 5b at a second relative speed slower than a first relative speed which will be explained later.

The irradiation with the laser light L1 forms the modified regions 7b within the sapphire substrate 2 along the lines 5b set along the A-plane of the sapphire substrate 2. Examples of the modified regions 7b formed here include molten processed regions, crack regions, dielectric breakdown regions, refractive index changed regions, and their mixed regions.

While a modified part is formed by irradiation with one pulse of the laser light L1, a plurality of modified parts are arranged along the line 5b at a second formation pitch narrower than a first formation pitch which will be explained later, so as to form the modified region 7b. The second formation pitch is a value obtained by dividing the second relative speed by the repetition frequency of the laser light L1. For example, letting the second relative speed and the repetition frequency of the laser light L1 be 600 mm/s and 100 kHz, respectively, the second formation pitch is 6 µm (=600 mm/s/100 kHz).

Next, as illustrated in FIG. 13(b), the sapphire substrate 2 is irradiated with the laser light L1 along the lines 5a while locating the converging point P1 within the sapphire substrate 2 and using the rear face 2b of the sapphire substrate 2 as the laser light entrance surface. Here, the support table 107 is shifted, so as to move the laser light L1 relatively along the lines 5a at the first relative speed.

The irradiation with the laser light L1 forms the modified regions 7a within the sapphire substrate 2 along the lines 5a set along the M-plane of the sapphire substrate 2. Examples of the modified regions 7b formed here include molten processed regions, crack regions, dielectric breakdown regions, refractive index changed regions, and their mixed regions.

While a modified part is formed by irradiation with one pulse of the laser light L1, a plurality of modified parts are arranged along the line 5a at the first formation pitch, so as to form the modified region 7a. The first formation pitch is a value obtained by dividing the first relative speed by the repetition frequency of the laser light L1. For example, letting the first relative speed and the repetition frequency of the laser light L1 be 1000 mm/s and 100 kHz, respectively, the first formation pitch is 10 µm (=1000 mm/s/100 kHz).

Figure 14:
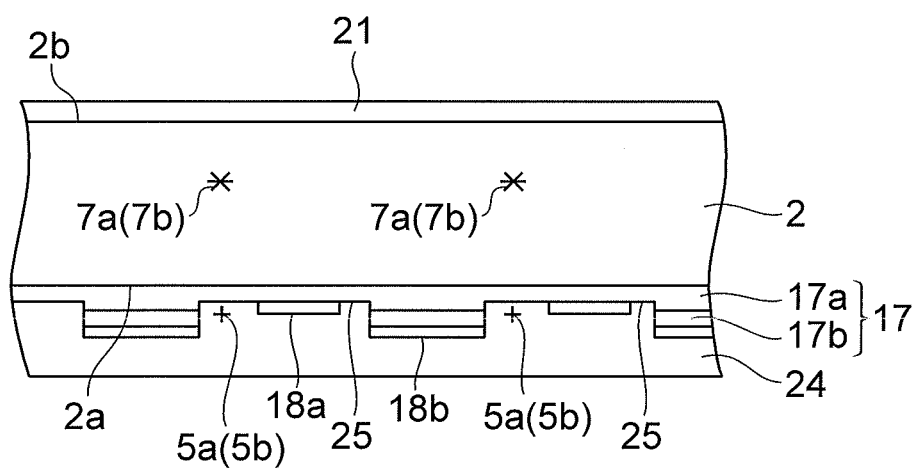
FIG. 14 is a partial sectional view of the wafer in a state where a light-reflecting layer is formed on the sapphire substrate of FIG. 13.

Next, as illustrated in FIG. 14, the sapphire substrate 2 having the protective tape 24 attached to the semiconductor layer 17 is transported to a reflective film forming device, where a light-reflecting layer 21 is formed on the rear face 2b of the sapphire substrate 2 having the modified regions 7a, 7b formed therein. The light-reflecting layer 21 includes a DBR (Distributed Bragg Reflector) film and a metal film formed on the outside of the DBR film and does not substantially transmit the laser light L1 therethrough (or reflects it). The light-reflecting layer 21 is used for enhancing the emission efficiency of the light-emitting diode produced. The protective tape 24 may be replaced with another protective tape (or protective member), so as to transport the sapphire substrate 2 having the latter protective tape (or protective member) attached to the semiconductor layer 17 to the reflective film forming device. In this case, it is desirable for the latter protective tape (or protective member) to have heat resistance.

Subsequently, as illustrated in FIG. 15, an expandable tape 29 is attached to the light-reflecting layer 21 so as to cover it, and the protective tape 24 is removed from the semiconductor layer 17. In this state, the sapphire substrate 2, semiconductor layer 17, and light-reflecting layer 21 (which will hereinafter be referred to as "sapphire substrate 2 and the like") are cut as follows.

That is, as illustrated in FIG. 15(a), a knife edge 28 is pressed along the lines 5b from the light-reflecting layer 21 side through the expandable tape 29, so as to extend fractures 26b generated from the modified regions 7b acting as a start point in the thickness direction of the sapphire substrate 2. This cuts the sapphire substrate 2 and the like into stripes along the lines 5b set along the A-plane of the sapphire substrate 2.

Next, as illustrated in FIG. 15(b), the knife edge 28 is pressed along the lines 5a from the light-reflecting layer 21 side through the expandable tape 29, so as to extend fractures 26a generated from the modified regions 7a acting as a start point in the thickness direction of the sapphire substrate 2. This cuts the sapphire substrate 2 and the like into chips along the lines 5a set along the M-plane of the sapphire substrate 2.

In the first embodiment, the fractures 26a, 26b do not reach the front and rear faces 2a, 2b of the sapphire substrate 2 until just before the sapphire substrate 2 and the like are cut by the knife edge 28 pressed thereon. However, the fractures 26a, 26b may be generated or not within the sapphire substrate 2 from the modified regions 7a, 7b acting as a start point until immediately before the sapphire substrate 2 and the like are cut by the knife edge 28 pressed thereon.

Figure 16:
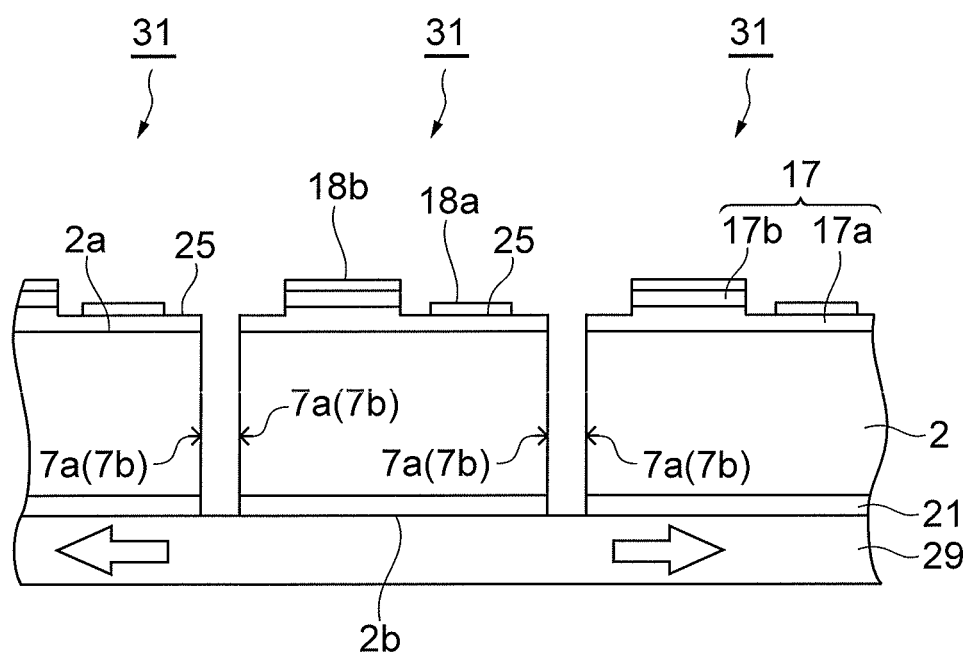
FIG. 16 is a sectional view of light-emitting devices in a state where the wafer of FIG. 15 is cut into the light-emitting devices.

Subsequently, as illustrated in FIG. 16, the expandable tape 29 is expanded, so that a plurality of light-emitting diodes 31 formed by cutting the sapphire substrate 2 and the like into chips are separated from each other. Each light-emitting diode 31 has the sapphire substrate 2, the pn-joined n- and p-type semiconductor layers 17a, 17b, the electrode 18a electrically connected to the n-type semiconductor layer 17a, the electrode 18b electrically connected to the p-type semiconductor layer 17b, and the light-reflecting layer 21.

As explained in the foregoing, the light-emitting device manufacturing method of the first embodiment irradiates the sapphire substrate 2 with the laser light L1 while using the rear face 2b of the sapphire substrate 2 as the laser light entrance surface before forming the light-reflecting layer 21 on the rear face 2b of the sapphire substrate 2, so as to form the modified regions 7a, 7b within the sapphire substrate 2. As a consequence, the light-reflecting layer 21 does not inhibit the laser light L1 from converging, whereby the desirable modified regions 7a, 7b can be formed within the sapphire substrate 2. Using the rear face 2b of the sapphire substrate 2 as the laser light entrance surface can also restrain the irradiation with the laser light L1 from damaging the semiconductor layer 17. Since the modified regions 7a, 7b are formed within the sapphire substrate 2, the desirable light-reflecting layer 21 can be formed on the rear face 2b of the sapphire substrate 2. Thus, the light-emitting device manufacturing method of the first embodiment can cut the sapphire substrate 2 formed with the desirable semiconductor layer 17 and light-reflecting layer 21 from the desirable modified regions 7a, 7b acting as a start point, whereby the light-emitting diode 31 having the light-reflecting layer 21 formed on the rear face 2b of the sapphire substrate 2 can be manufactured with a favorable yield.

When cutting the sapphire substrate 2 and the like, the knife edge 28 is pressed along the lines 5a, 5b from the light-reflecting layer 21 side, so as to extend the fractures 26a, 26b generated from the modified regions 7a, 7b acting as a start point in the thickness direction of the sapphire substrate 2. This can easily cut the sapphire substrate 2 and the like along the lines 5a, 5b, while inhibiting the semiconductor layer 17 from being damaged by the knife edge 28 pressed thereon.

A plurality of modified parts are formed at the first pitch for the line 5a set along the M-plane of the sapphire substrate 2, while a plurality of modified parts are formed at the second pitch, which is narrower than the first pitch, for the line 5b set along the A-plane of the sapphire substrate 2. Thus forming the modified parts restrain both of the fractures 26a, 26b generated from the modified regions 7a, 7b formed along the lines 5a, 5b from meandering.

This is based on the finding that, when a plurality of modified parts for the line 5b are formed at the first formation pitch as with the line 5a, the fractures 26b generated from the modified region 7b formed along the line 5b tend to meander greatly. This seems to be because the sapphire substrate 2 is harder to cleave (i.e., requires a greater cutting force) along the lines 5b set along the A-plane of the sapphire substrate 2 than along the lines 5a set along the M-plane of the sapphire substrate 2.

When forming the modified regions 7a, 7b, the modified regions 7b are formed along the lines 5b set along the A-plane of the sapphire substrate 2, and then the modified regions 7a are formed along the lines 5a set along the M-plane of the sapphire substrate 2. For the line 5b set along the A-plane, it is desirable that a plurality of modified parts be formed more accurately at the second pitch narrower than the first pitch as mentioned above. Therefore, forming the modified regions 7b before forming the modified regions 7a can prevent the modified regions 7a from obstructing the irradiation with the laser light L1 for forming the modified region 7b in parts where the lines 5b intersect the lines 5a at the time of forming the modified regions 7b. This can more effectively restrain the fractures 26b generated from the modified regions 7b formed along the lines 5b from meandering.

During the irradiation with the laser light L1, the converging point P1 of the laser light L1 is relatively moved along the lines 5a at the first relative speed and along the lines 5b at the second relative speed slower than the first relative speed. As a consequence, the first formation pitch and the second formation pitch narrower than the first formation pitch can be adjusted easily and accurately.

When being cut, the sapphire substrate 2 and the like are cut into stripes along the lines 5b set along the A-plane of the sapphire substrate 2 and then into chips along the lines 5a set along the M-plane of the sapphire substrate 2. This can reduce the force required for cutting the sapphire substrate 2 and the like along the lines 5b, thereby improving the accuracy in cutting the sapphire substrate 2 and the like along the lines 5b. This is based on the finding that a greater cutting force is required (a greater force is necessary for cutting) when the modified region 7b formed along the A-plane acts as a cutting start point than when the modified region 7a formed along the M-plane does. This is also because a greater cutting force is required for cutting the sapphire substrate 2 and the like along the lines 5b in the state where the sapphire substrate 2 and the like are cut along the lines 5a than not.

There is a case where it is preferable to cut the sapphire substrate 2 and the like into stripes along the lines 5a set along the M-plane of the sapphire substrate 2 and then into chips along the lines 5b set along the A-plane of the sapphire substrate 2. Since a plurality of modified parts are formed for the line 5a at the first formation pitch wider than the second formation pitch, cutting the sapphire substrate 2 and the like along the lines 5a in the state where the sapphire substrate 2 and the like are cut along the lines 5b may lower the accuracy in cutting the sapphire substrate 2 and the like along the lines 5a. By contrast, since a plurality of modified parts are formed for the line 5b at the second formation pitch narrower than the first formation pitch, cutting the sapphire substrate 2 and the like along the lines 5b in the state where the sapphire substrate 2 and the like are cut along the lines 5a may restrain the accuracy in cutting the sapphire substrate 2 and the like along the line 5b from lowering. Therefore, cutting the sapphire substrate 2 and the like from the modified regions 7a before from the modified regions 7b can improve the accuracy in cutting the sapphire substrate 2 and the like along the lines 5a while restraining the accuracy in cutting the sapphire substrate 2 and the like along the lines 5b from lowering.

Second Embodiment

The light-emitting device manufacturing method of the second embodiment differs from that of the first embodiment mainly in that the fractures 26a, 26b are caused to reach at least the front face 2a of the sapphire substrate 2 beforehand while the modified regions 7a, 7b are formed by irradiation with the laser light L1.

That is, as illustrated in FIG. 17(a), after forming the semiconductor layer 17 on the front face 2a of the sapphire substrate 2, the sapphire substrate 2 is irradiated with the laser light L1 along the lines 5b while locating the converging point P1 within the substrate 2 and using the rear face 2b thereof as the laser light entrance surface. Here, irradiation conditions for the laser light L1 (the distance from the front face 2a of the sapphire substrate 2 to the converging point P1 and the like) are adjusted, so as to form the modified regions 7b within the sapphire substrate 2 along the lines 5b such that the fractures 26b reach at least the front face 2a of the sapphire substrate 2 beforehand.

Subsequently, as illustrated in FIG. 17(b), the sapphire substrate 2 is irradiated with the laser light L1 along the lines 5a while locating the converging point P1 within the substrate 2 and using the rear face 2b thereof as the laser light entrance surface. Here, irradiation conditions for the laser light L1 are adjusted, so as to form the modified regions 7a within the sapphire substrate 2 along the lines 5a such that the fractures 26a reach at least the front face 2a of the sapphire substrate 2 beforehand.

As in the first embodiment, a plurality of modified parts are formed at the first formation pitch for the line 5a set along the M-plane of the sapphire substrate 2, a plurality of modified parts are formed at the second formation pitch narrower than the first formation pitch for the line 5b set along the A-plane of the sapphire substrate 2, and so forth. As mentioned in the first embodiment, the fractures 26a, 26b generated when forming the modified regions 7a, 7b are extended in the thickness direction of the sapphire substrate 2 when cutting the sapphire substrate 2 and the like. The fractures 26a, 26b, which are only required to reach at least the front face 2a of the sapphire substrate 2 when forming the modified regions 7a, 7b, may reach the inside or outer surface of the semiconductor layer 17 when forming the modified regions 7a, 7b.

As explained in the foregoing, the light-emitting device manufacturing method of the second embodiment exhibits the following effects in addition to those of the light-emitting device manufacturing method of the first embodiment. That is, the light-emitting device manufacturing method of the second embodiment forms the modified regions 7a, 7b within the sapphire substrate 2 along the lines 5a, 5b so that the fractures 26a, 26b to extend in the thickness direction of the sapphire substrate 2 reach at least the front face 2a of the sapphire substrate 2 beforehand. This makes it easier for the fractures 26a, 26b to open and extend toward the rear face 2b of the sapphire substrate 2 when the knife edge 28 is pressed along the lines 5a, 5b from the light-reflecting layer 21 side, for example, whereby the sapphire substrate 2 and the like can be cut easily (with a relatively small force) along the lines 5a, 5b. Further, causing the fractures 26a, 26b to reach at least the front face 2a of the sapphire substrate 2 beforehand can improve the accuracy in cutting the semiconductor layer 17.

When forming the light-reflecting layer 21, the sapphire substrate 2 is placed in a heating furnace for vacuum deposition and the like, whereby the sapphire substrate 2 is likely to warp because of the difference in coefficient of thermal expansion between the sapphire substrate 2 and semiconductor layer 17 so as to expand and shrink on the rear and front face sides 2b, 2a, respectively. Here, the fractures 26a, 26b have already reached the front face 2a of the sapphire substrate 2, whereby the sapphire substrate 2 warps so as to close the fractures 26a, 26b. Therefore, when forming the light-reflecting layer 21 on the rear face 2b of the sapphire substrate 2, the fractures 26a, 26b are harder to reach the rear face 2b of the sapphire substrate 2.

From the viewpoint of making it hard for the fractures 26a, 26b to reach the rear face 2b of the sapphire substrate 2 when forming the light-reflecting layer 21 on the rear face 2b of the sapphire substrate 2, it is desirable for the fractures 26a, 26b generated at the time of forming the modified regions 7a, 7b to stop at the front face 2a of the sapphire substrate 2 or within the semiconductor layer 17 without reaching the outer surface of the semiconductor layer 17.

Third Embodiment

The light-emitting device manufacturing method of the third embodiment differs from that of the first embodiment mainly in that the fractures 26a, 26b are caused to reach at least the rear face 2b of the sapphire substrate 2 beforehand while the modified regions 7a, 7b are formed by irradiation with the laser light L1.

That is, as illustrated in FIG. 18(a), after forming the semiconductor layer 17 on the front face 2a of the sapphire substrate 2, the sapphire substrate 2 is irradiated with the laser light L1 along the lines 5b while locating the converging point P1 within the substrate 2 and using the rear face 2b thereof as the laser light entrance surface. Here, irradiation conditions for the laser light L1 (the distance from the front face 2a of the sapphire substrate 2 to the converging point P1 and the like) are adjusted, so as to form the modified regions 7b within the sapphire substrate 2 along the lines 5b such that the fractures 26b reach at least the rear face 2b of the sapphire substrate 2 beforehand.

Subsequently, as illustrated in FIG. 18(b), the sapphire substrate 2 is irradiated with the laser light L1 along the lines 5a while locating the converging point P1 within the substrate 2 and using the rear face 2b thereof as the laser light entrance surface. Here, irradiation conditions for the laser light L1 are adjusted, so as to form the modified regions 7a within the sapphire substrate 2 along the lines 5a such that the fractures 26a reach at least the front face 2a of the sapphire substrate 2 beforehand.

As in the first embodiment, a plurality of modified parts are formed at the first formation pitch for the line 5a set along the M-plane of the sapphire substrate 2, a plurality of modified parts are formed at the second formation pitch narrower than the first formation pitch for the line 5b set along the A-plane of the sapphire substrate 2, and so forth. As mentioned in the first embodiment, the fractures 26a, 26b generated when forming the modified regions 7a, 7b are extended in the thickness direction of the sapphire substrate 2 when cutting the sapphire substrate 2 and the like.

As explained in the foregoing, the light-emitting device manufacturing method of the third embodiment exhibits the following effects in addition to those of the light-emitting device manufacturing method of the first embodiment. That is, the light-emitting device manufacturing method of the third embodiment forms the modified regions 7a, 7b within the sapphire substrate 2 along the lines 5a, 5b so that the fractures 26a, 26b to extend in the thickness direction of the sapphire substrate 2 reach at least the rear face 2b of the sapphire substrate 2 beforehand. This makes it easier for the fractures 26a, 26b to open and extend toward the semiconductor layer 17 when the knife edge 28 is pressed along the lines 5a, 5b from the semiconductor layer 17 side or when the expandable tape 29 attached to the rear face 2b of the sapphire substrate 2 is expanded, for example, whereby the sapphire substrate 2 and the like can be cut easily (with a relatively small force) along the lines 5a, 5b. Further, causing the fractures 26a, 26b to reach at least the rear face 2b of the sapphire substrate 2 beforehand can improve the accuracy in cutting the light-reflecting layer 21.

When forming the modified regions 7a, 7b, the converging point P1 of the laser light L1 can be distanced from the semiconductor layer 17, so that the semiconductor layer 17 can further be restrained from being damaged by irradiation with the laser light L1.

The fractures 26a, 26b have already reached the rear face 2b of the sapphire substrate 2 when forming the light-reflecting layer 21, but are substantially closed and thus do not inhibit the light-reflecting layer 21 from being formed on the rear face 2b of the sapphire substrate 2.

Fourth Embodiment

The light-emitting device manufacturing method of the fourth embodiment differs from that of the first embodiment mainly in that the sapphire substrate 2 and the like are cut by irradiation with laser light L2.

That is, as illustrated in FIG. 19(a), after forming the modified regions 7a, 7b within the sapphire substrate 2, the sapphire substrate 2 is irradiated with the laser light (second laser light) L2 absorbable in the light-reflecting layer 21 along the lines 5b from the light-reflecting layer 21 side while locating a converging point P2 within the light-reflecting layer 21, so as to extend the fractures 26b generated from the modified regions 7b acting as a start point in the thickness direction of the sapphire substrate 2. The expansion of the fractures 26b is induced by the heat occurring as a result of absorption of the laser light L2 in the light-reflecting layer 21. This cuts the sapphire substrate 2 and the like into stripes along the lines 5b set along the A-plane of the sapphire substrate 2.

Subsequently, as illustrated in FIG. 19(b), the sapphire substrate 2 is irradiated with the second laser light L2 along the lines 5a from the light-reflecting layer 21 side while locating the converging point P2 within the light-reflecting layer 21, so as to extend the fractures 26a generated from the modified regions 7a acting as a start point in the thickness direction of the sapphire substrate 2. The expansion of the fractures 26a is induced by the heat occurring as a result of absorption of the laser light L2 in the light-reflecting layer 21. This cuts the sapphire substrate 2 and the like into chips along the lines 5a set along the M-plane of the sapphire substrate 2.

Depending on the irradiation with the laser light L2, the fractures 26a, 26b may merely extend in the thickness direction of the sapphire substrate 2 without reaching at least one of the outer surface of the semiconductor layer 17 and the outer surface of the light-reflecting layer 21. In this case, an external force may be exerted along the lines 5a, 5b by pressing the knife edge 28, expanding the expandable tape 29, and so forth, so as to extend the fractures 26a, 26b further in the thickness direction of the sapphire substrate 2, thereby cutting the sapphire substrate 2 and the like along the lines 5a, 5b.

As explained in the foregoing, the light-emitting device manufacturing method of the fourth embodiment exhibits the following effects in addition to those of the light-emitting device manufacturing method of the first embodiment. That is, the light-emitting device manufacturing method of the fourth embodiment extends the fractures 26a, 26b by letting the light-reflecting layer 21 absorb the laser light L2, so that the fractures 26a, 26b generated from the modified regions 7a, 7b acting as a start point can extend in the thickness direction of the sapphire substrate 2 while restraining the semiconductor layer 17 from being damaged by the irradiation with the laser light L2.

Fifth Embodiment

The light-emitting device manufacturing method of the fifth embodiment differs from that of the first embodiment mainly in that the sapphire substrate 2 and the like are cut by irradiation with laser light L3.

That is, as illustrated in FIG. 20(a), after forming the modified regions 7a, 7b within the sapphire substrate 2, the sapphire substrate 2 is irradiated with the laser light (third laser light) L3 transmittable through the semiconductor layer 17 along the lines 5b from the semiconductor layer 17 side while locating a converging point P3 within the semiconductor substrate 2, so as to extend the fractures 26b generated from the modified regions 7b acting as a start point in the thickness direction of the sapphire substrate 2. The expansion of the fractures 26b is caused by thermal induction occurring as a result of absorption of the laser light L3 in the already formed modified regions 7b and thereabout after having been transmitted through the semiconductor layer 17 or new modified regions formed thereby. This cuts the sapphire substrate 2 and the like into stripes along the lines 5b set along the A-plane of the sapphire substrate 2. When the semiconductor layer 17 is made of GaN, the laser light L3 transmittable to the semiconductor layer 17 has a wavelength of 1340 nm (using an Nd:YVO$_4$ laser), for example.

Subsequently, as illustrated in FIG. 20(b), the sapphire substrate 2 is irradiated with the laser light L3 along the lines 5a from the semiconductor layer 17 side while locating the converging point P3 within the sapphire substrate 2, so as to extend the fractures 26a generated from the modified regions 7a acting as a start point in the thickness direction of the sapphire substrate 2. The expansion of the fractures 26a is caused by thermal induction occurring as a result of absorption of the laser light L3 in the already formed modified regions 7a and thereabout after having been transmitted through the semiconductor layer 17 or new modified regions formed thereby. This cuts the sapphire substrate 2 and the like into chips along the lines 5a set along the M-plane of the sapphire substrate 2.

Depending on the irradiation with the laser light L3, the fractures 26a, 26b may merely extend in the thickness direction of the sapphire substrate 2 without reaching at least one of the outer surface of the semiconductor layer 17 and the outer surface of the light-reflecting layer 21. In this case, an external force may be exerted along the lines 5a, 5b by pressing the knife edge 28, expanding the expandable tape 29, and so forth, so as to extend the fractures 26a, 26b further in the thickness direction of the sapphire substrate 2, thereby cutting the sapphire substrate 2 and the like along the lines 5a, 5b.

As explained in the foregoing, the light-emitting device manufacturing method of the fifth embodiment exhibits the following effects in addition to those of the light-emitting device manufacturing method of the first embodiment. That is, the light-emitting device manufacturing method of the fifth embodiment extends the fractures 26a, 26b by letting predetermined parts within the light-reflecting layer 21 absorb the laser light L3, while transmitting it through the semiconductor layer 17, so that the fractures 26a, 26b generated from the modified regions 7a, 7b acting as a start point can extend in the thickness direction of the sapphire substrate 2 while restraining the semiconductor layer 17 from being damaged by the irradiation with the laser light L3.

Figure 21:
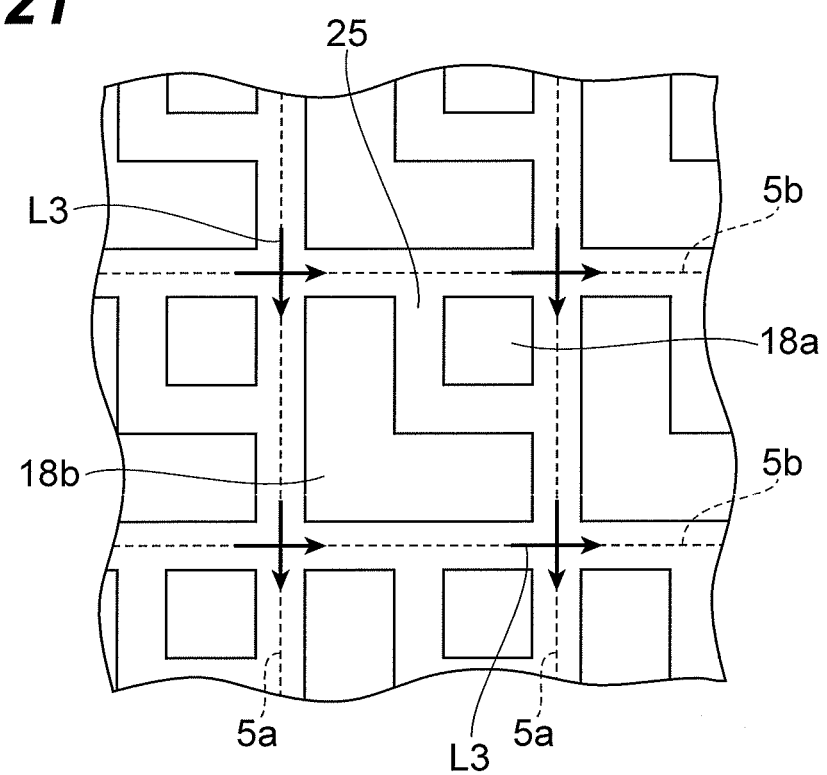
FIG. 21 is a partial plan view of the wafer of FIG. 20.

As illustrated in FIG. 21, irradiation with the laser light L3 may be controlled in an ON/OFF manner so that the sapphire substrate 2 is irradiated with the laser light L3 along the lines 5a, 5b in only intersecting parts between the lines 5a, 5b. This can extend the fractures 26a, 26b generated from the modified regions 7a, 7b acting as a start point in the thickness direction of the sapphire substrate 2 in the intersecting parts of the lines 5a, 5b where accuracy in cutting is required, while further restraining the semiconductor layer 17 from being damaged by the irradiation with the laser light L3.

Figure 22:
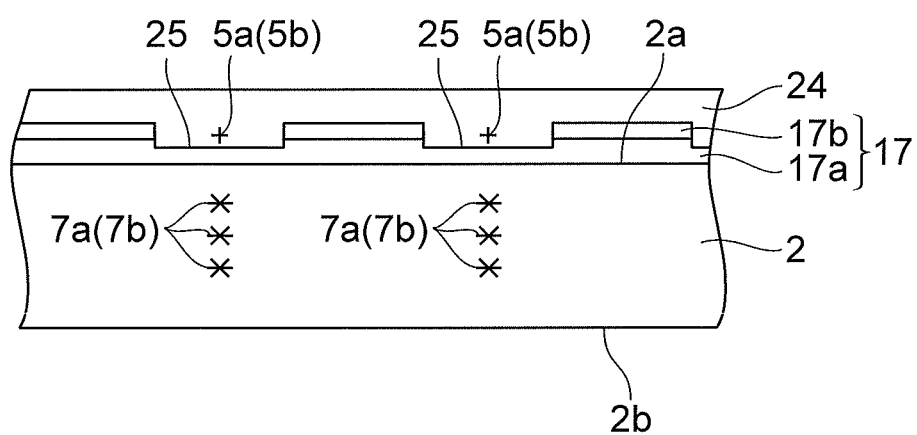
FIG. 22 is a partial sectional view of the wafer for explaining a modified example of the light-emitting device manufacturing method.

Though embodiments of the present invention have been explained in the foregoing, the present invention is not limited to the above-mentioned embodiments. For example, when forming the modified regions 7a (7b), a plurality of rows of modified regions 7a (7b) may be arranged in the thickness direction of the sapphire substrate 2 for one line to cut 5a (5b) as illustrated in FIG. 22. This makes it possible to cut the sapphire substrate 2 and the like by breaking it with a smaller force even when the sapphire substrate 2 is relatively thick.

Figure 23:
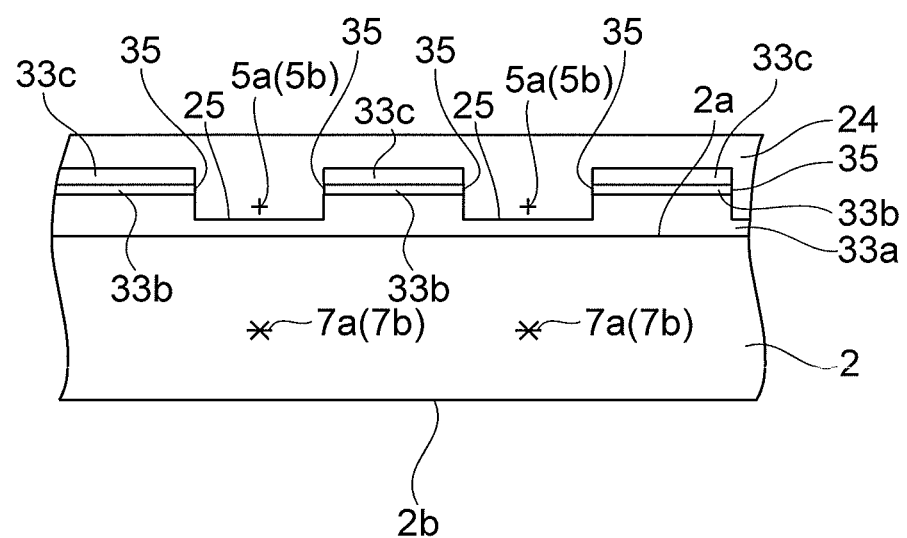
FIG. 23 is a partial sectional view of the wafer for explaining another modified example of the light-emitting device manufacturing method.

Semiconductor lasers can be manufactured as the light-emitting device. In this case, as illustrated in FIG. 23, the sapphire substrate 2 is prepared, and an n-type semiconductor layer 33a which is a first conduction type semiconductor layer, an active layer 33b, and a p-type semiconductor layer 33c which is a second conduction type semiconductor layer are formed in this order on the front face 2a of the sapphire substrate 2. The n-type semiconductor layer 33a, active layer 33b, and p-type semiconductor layer 33c are made of a III-V compound semiconductor such as GaN, for example, and constitute a quantum well structure. Subsequently, a depression 25 is formed along the lines 5a (5b) so that its bottom face is located halfway through the n-type semiconductor layer 33a, thereby producing resonance surfaces 35 opposing each other through the active layer 33b. Thereafter, as in the above-mentioned method of manufacturing the light-emitting diode 31, a light-reflecting layer is formed, and the n-type semiconductor layer 33a, active layer 33b, p-type semiconductor layer 33c, sapphire substrate 2, and light-reflecting layer are cut along the lines 5a (5b).

Before forming the modified regions 7a (7b), the rear face 2b of the sapphire substrate 2 of the sapphire substrate 2 may be polished, so as to thin the sapphire substrate 2. In this case, as illustrated in FIG. 24(a), the protective tape 24 is attached to the semiconductor layer 17 so as to cover the latter. Then, as illustrated in FIG. 24(b), the rear face 2b of the sapphire substrate 2 is polished, so as to thin the sapphire substrate 2 to a predetermined thickness.

Examples of materials employable for the semiconductor layer 17 include not only nitride semiconductors such as GaN, but also III-V compound semiconductors such as GaAlAs, GaAlAsP, and GaAlInP. The semiconductor layer 17 may be formed on the front face 2a of the sapphire substrate 2 directly or indirectly through some films or layers. Contact layers for electric connections, light-reflecting layers, and the like may be formed on the front face 2a of the sapphire substrate 2. The first and second conduction types, which are respectively n and p in the above-mentioned embodiments, may be reversed.

The modified regions may be caused not only by multiphoton absorption but also by other kinds of optical absorption such as light absorption corresponding to the multiphoton absorption or under thermal influences. That is, the multiphoton absorption is an example of phenomena which can form the modified regions.

For relatively moving the converging point P1 of the laser light L1 along the lines 5a, 5b, the laser light source 101 side (including the laser light source 101, dichroic mirror 102, and condenser lens 105) or both of the support table 107 and laser light source 101 may be moved.

In each of the above-mentioned embodiments using the protective tape 23, means other than the protective tape 23 may also be used as long as they can fix the sapphire substrate 2 during etching. For example, not only the protective tape 23, but methods for fixing wafers (sapphire substrates) typically used in semiconductor processes can also be utilized.

In each of the above-mentioned embodiments using the protective tape 24, it is subsequently placed in an environment at a temperature of 150° C. to 300° C. under substrate heating and the like at the time of forming the light-reflecting layer 21 and thus preferably has heat resistance at the temperature at the time of forming the light-reflecting layer 21. Though an elastic resin tape is used as the protective tape 24 for protecting the semiconductor layer 17, various holding members other than the protective tape 24 can also be utilized as long as they can function to protect the semiconductor layer 17. For example, a substrate (made of a rigid body such as glass, ceramics, metals, or the like) having a front face provided with an adhesive layer functioning to come into contact with and fix the semiconductor layer 17 may be utilized as a holding member. It is also preferable for such a holding member to have heat resistance at the temperature at the time of forming the light-reflecting layer 21. Before forming the light-reflecting layer 21, the protective tape 24 may be replaced with other protective tapes or protective members having heat resistance at the temperature at the time of forming the light-reflecting layer 21.

The present invention can manufacture with a favorable yield a light-emitting device having a light-reflecting layer formed on the rear face of a sapphire substrate.

What is claimed is:

1. A method for manufacturing a light-emitting device comprising:
a second step of irradiating a sapphire substrate having a front face formed with a III-V compound semiconductor layer with first laser light along a predetermined line to cut while locating a converging point within the sapphire substrate and using a rear face of the sapphire substrate as a laser entrance surface, and thereby forming a modified region within the sapphire substrate along the line;
a third step of forming a light-reflecting layer on the rear face of the sapphire substrate after the second step; and
a fourth step of extending a fracture generated from the modified region acting as a start point in a thickness direction of the sapphire substrate after the third step, and thereby cutting the sapphire substrate, the III-V compound semiconductor layer and the light-reflecting layer along the line, and manufacturing the light-emitting device.

2. A method for manufacturing a light-emitting device according to claim 1, wherein, in the second step, the modified region is formed within the sapphire substrate along the line so that the fracture to be extended in the thickness direction of the sapphire substrate in the fourth step reaches at least the front face of the sapphire substrate beforehand.

3. A method for manufacturing a light-emitting device according to claim 1, wherein, in the second step, the modified region is formed within the sapphire substrate along the line so that the fracture to be extended in the thickness direction of the sapphire substrate in the fourth step reaches the rear face of the sapphire substrate beforehand.

4. A method for manufacturing a light-emitting device according to claim 1, wherein, in the fourth step, a knife edge is pressed along the line from the light-reflecting layer side, and thereby the fracture generated from the modified region acting as the start point is extended in the thickness direction.

5. A method for manufacturing a light-emitting device according to claim 1, further comprising the step of irradiating the sapphire substrate with second laser light absorbable in the light-reflecting layer from the light-reflecting layer side along the line after the third step but before the fourth step, and thereby extending the fracture generated from the modified region acting as the start point in the thickness direction of the sapphire substrate;
wherein, in the fourth step, the fracture generated from the modified region acting as the start point is further extended in the thickness direction of the sapphire substrate, and thereby the sapphire substrate, the III-V compound semiconductor layer and the light-reflecting layer are cut along the line.

6. A method for manufacturing a light-emitting device according to claim 1, wherein in the fourth step, the sapphire substrate is irradiated with second laser light absorbable in the light-reflecting layer from the light-reflecting layer side along the line, and thereby the fracture generated from the modified region acting as the start point is extended in the thickness direction of the sapphire substrate.

7. A method for manufacturing a light-emitting device according to claim 1, further comprising the step of irradiating the sapphire substrate with third laser light transmittable through the III-V compound semiconductor layer from the III-V compound semiconductor layer side along the line while locating a converging point within the sapphire substrate after the third step but before the fourth step, and thereby extending the fracture generated from the modified region acting as the start point in the thickness direction of the sapphire substrate;
wherein, in the fourth step, the fracture generated from the modified region acting as the start point is further extended in the thickness direction of the sapphire substrate, and thereby the sapphire substrate, the III-V compound semiconductor layer and the light-reflecting layer are cut along the line.

8. A method for manufacturing a light-emitting device according to claim 1, wherein, in the fourth step, the sapphire substrate is irradiated with third laser light transmittable through the III-V compound semiconductor layer from the III-V compound semiconductor layer side along the line while locating a converging point within the sapphire substrate, and thereby the fracture generated from the modified region acting as the start point is extended in the thickness direction of the sapphire substrate.

9. A method for manufacturing a light-emitting device according to claim 7, wherein the sapphire substrate is irradiated with the third laser light from the III-V compound semiconductor layer side along the line in only an intersecting part of the line.

10. A method for manufacturing a light-emitting device according to claim 1, further comprising a first step of forming the III-V compound semiconductor layer on the front face of the sapphire substrate before the second step.

11. A method for manufacturing a light-emitting device according to claim 8, wherein the sapphire substrate is irradiated with the third laser light from the III-V compound semiconductor layer side along the line in only an intersecting part of the line.

* * * * *